(12) United States Patent
Yang et al.

(10) Patent No.: US 10,188,002 B2
(45) Date of Patent: Jan. 22, 2019

(54) FLEXIBLE SCREEN MODULE AND ELECTRONIC DEVICE HAVING THE MODULE

(71) Applicant: SHENZHEN ROYOLE TECHNOLOGIES CO. LTD., Shenzhen (CN)

(72) Inventors: Songling Yang, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 20 days.

(21) Appl. No.: 15/509,119

(22) PCT Filed: Sep. 15, 2014

(86) PCT No.: PCT/CN2014/000841
§ 371 (c)(1),
(2) Date: Mar. 6, 2017

(87) PCT Pub. No.: WO2016/041096
PCT Pub. Date: Mar. 24, 2016

(65) Prior Publication Data
US 2017/0280571 A1    Sep. 28, 2017

(51) Int. Cl.
*H05K 5/00* (2006.01)
*G06F 1/16* (2006.01)
(Continued)

(52) U.S. Cl.
CPC ......... *H05K 5/0017* (2013.01); *G06F 1/1652* (2013.01); *G06F 1/1683* (2013.01);
(Continued)

(58) Field of Classification Search
CPC .................................................... G03B 21/58
(Continued)

(56) References Cited

U.S. PATENT DOCUMENTS

| 4,416,511 A * | 11/1983 | Weinberg | G03B 21/58 |
| | | | 160/238 |
| 2005/0026660 A1 * | 2/2005 | Park | H01Q 1/243 |
| | | | 455/575.5 |

(Continued)

FOREIGN PATENT DOCUMENTS

| CN | 201185067 | 1/2009 |
| CN | 201886272 | 6/2011 |

(Continued)

OTHER PUBLICATIONS

The extended European search report dated Jan. 10, 2018 from corresponding application No. EP 14902025.7.
(Continued)

*Primary Examiner* — Christopher E Mahoney
(74) *Attorney, Agent, or Firm* — Hauptman Ham, LLP

(57) ABSTRACT

A flexible screen module comprises a rotating shaft, a flexible screen and a connector. The rotating shaft has an external wall and a passage extending through the rotating shaft in an axial direction thereof, and one end of the flexible screen is fixed on the external wall and is rollable around the rotating shaft. The connector comprises a body, a first connecting part which is on one end of the body and electrically connected to the flexible screen, and a second connecting part on another end of the body, wherein the body at least partially passes through the passage, and the first and the second connecting parts are located outside two sides in the axial direction of the rotating shaft.

20 Claims, 3 Drawing Sheets

(51) Int. Cl.
  *G09F 9/30* (2006.01)
  *H05K 1/18* (2006.01)
(52) U.S. Cl.
  CPC .............. *G09F 9/30* (2013.01); *H05K 1/189* (2013.01); *H05K 5/0069* (2013.01); *G09F 9/301* (2013.01)
(58) Field of Classification Search
  USPC ........................................................ 359/461
  See application file for complete search history.

(56) References Cited

U.S. PATENT DOCUMENTS

| | | | |
|---|---|---|---|
| 2010/0026952 A1* | 2/2010 | Miura | G02F 1/133305 349/150 |
| 2011/0094775 A1 | 4/2011 | Lin et al. | |
| 2012/0002357 A1 | 1/2012 | Auld et al. | |
| 2012/0162876 A1* | 6/2012 | Kim | H04M 1/0237 361/679.01 |
| 2013/0170157 A1* | 7/2013 | Park | H04M 1/0268 361/749 |

FOREIGN PATENT DOCUMENTS

| | | |
|---|---|---|
| CN | 203057227 | 7/2013 |
| EP | 0424074 | 4/1991 |
| JP | 9-114403 | 5/1997 |
| JP | 2012-508402 | 4/2012 |
| KR | 10-2014-0101124 | 8/2014 |

OTHER PUBLICATIONS

International search report dated Jun. 4, 2015 from corresponding application No. PCT/CN2014000841.
Office Action dated Apr. 3, 2018 from corresponding application No. JP 2017-514417.
Office Action dated Feb. 27, 2018 from corresponding application No. KR 10-2017-7010139.

* cited by examiner

FLEXIBLE SCREEN MODULE AND ELECTRONIC DEVICE HAVING THE MODULE

TECHNICAL FIELD

The present disclosure relates to a flexible screen, and particularly to a flexible screen module and an electronic device having the module.

BACKGROUND

In order to control a displayed image, all screen modules need to be provided with an interface connected with a control circuit. An existing mainstream screen module comprises LCD module and OLED module. A structure included in both types of display modules is a thin film transistor, i.e. TFT, provided on a rigid glass substrate. The above interface is just connected to the TFT through one driving circuit to realize control thereto, and further to control display of the display modules. When the above screen module is mounted to an electronic device, it just needs to connect this interface to a corresponding control circuit.

Recently, appearance of flexible OLED screen makes it possible for the form of the screen module to have many variation modes, rather than merely a conventional plane. One is winding the screen like a drape to flexibly change the size of the screen, while this involves how to design the above interface so as to be adapted to collection or winding of the flexible screen. An existing practice is to design the interface into a structure of an electric brush and a commutator similar to a motor, and this "electric brush" is used to be connected to the above control circuit. However, such structure has relatively low reliability and durability.

SUMMARY

Embodiments of the present disclosure provide a flexible screen module having a structure with relatively high reliability and durability and being adaptable to collection or winding of a flexible screen and an electronic device having the module.

A flexible screen module comprises one rotating shaft, one flexible screen, and one connector. The rotating shaft has an external wall and a passage penetrating through the rotating shaft in an axial direction thereof. The flexible screen has one end fixed to the external wall and is able to be wound around the rotating shaft. The connector comprises a body (in other words, main body), a first connecting part which is on one end of the body and electrically connected to the flexible screen, and a second connecting part on the other end of the body, wherein the body at least partially passes through the passage and the first and second connecting parts are located outside two sides in the axial direction of the rotating shaft.

An electronic device has the above flexible screen module.

In the present disclosure, the body of the connector only deforms but is not worn during the rotation process of the rotating shaft, such that it is not easy to break, thus improving the usage life of the flexible screen module. The present disclosure further provides an electronic device having the flexible screen module.

BRIEF DESCRIPTION OF THE DRAWINGS

The following figures are used to describe various embodiments of the present disclosure in detail in conjunction with the embodiments. It should be understood that various elements schematically illustrated in the figures do not represent an actual size or a proportional relationship, but are merely schematic diagrams illustrated for clear description, and should not be construed as limiting the present disclosure.

DETAILED DESCRIPTION OF ILLUSTRATED EMBODIMENTS

In order to make objects, technical solutions and advantages of the present disclosure more clear, in the following, the present disclosure is further described in detail in conjunction with a plurality of embodiments and figures. It should be understood that the embodiments described herein are merely for illustrating the present disclosure rather than limiting the present disclosure.

Figure 1:
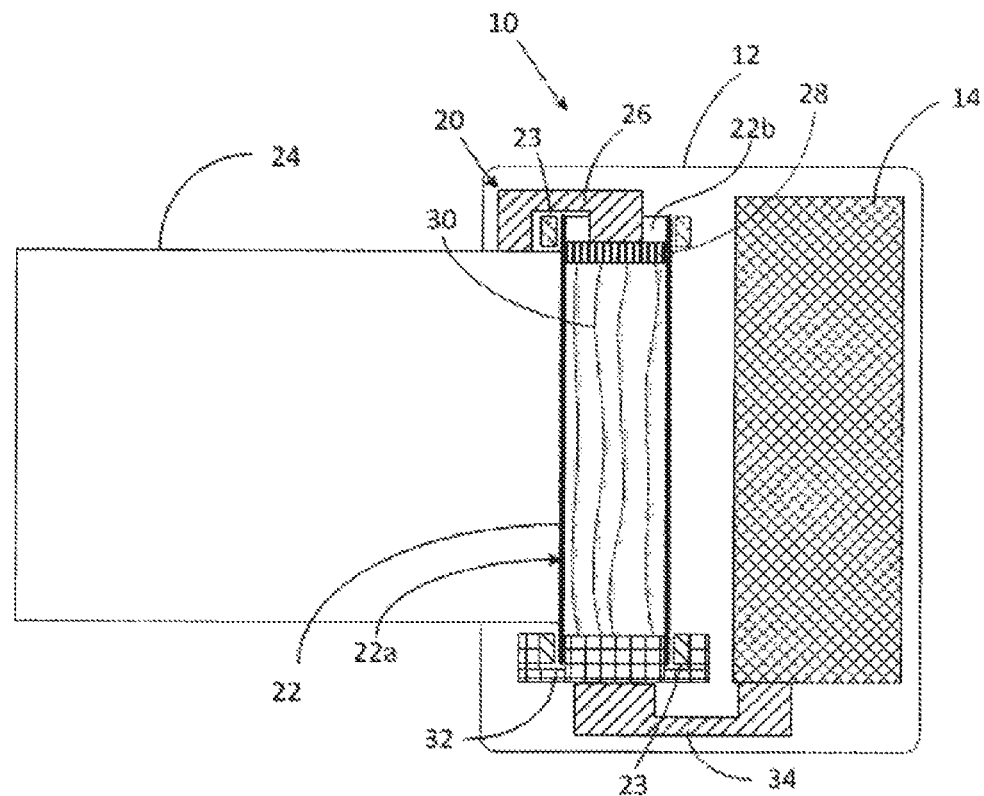
FIG. 1 is a schematic diagram of an electronic device having a flexible display module provided in a first embodiment of the present disclosure.

In conjunction with FIG. 1, it is a structural schematic diagram of an electronic device having a flexible display module provided in a first embodiment of the present disclosure. An electronic device 10 comprises one casing 12, a circuit board 14 and a flexible screen module 20, the circuit board 14 and the flexible screen module 20 being fixed and housed in the casing 12. A flexible screen of the flexible screen module 20 can be rolled and also can be unfolded, and when being unfolded, it can be extended to the outside of the casing 12 through a through hole provided on the casing 12 for users to view.

Specifically, the flexible screen module 20 comprises one rotating shaft 22, two bearings 23, one flexible screen 24, one first connecting element 26, one first adapting part 28, a plurality of wires 30, one second adapting part 32 and one second connecting element 34. The rotating shaft 22 has an external wall 22a and a passage 22b penetrating (in other words, extending) through the rotating shaft in an axial direction thereof. In the present embodiment, the rotating shaft 22 is a hollow cylindrical pipe. The flexible screen 24 substantially has a rectangular shape, and has one end fixed to the external wall 22a of the rotating shaft, for example, fixed to the external wall 22a through an adhesive. Thus, when the rotating shaft 22 rotates, the flexible screen 24 can be wound around the rotating shaft 22 or unfolded from the rotating shaft 22 to be extended to the outside of the casing 12. Two bearings 23 are fixed to the rotating shaft 22 and located at both sides of the flexible screen 24. Each bearing 23 has an outer ring, an inner ring, and a roller or a ball sandwiched therebetween, while these structures are common technologies and will not be described in detail herein. The outer ring of each bearing 23 is fixed to the casing 12.

Figure 2:
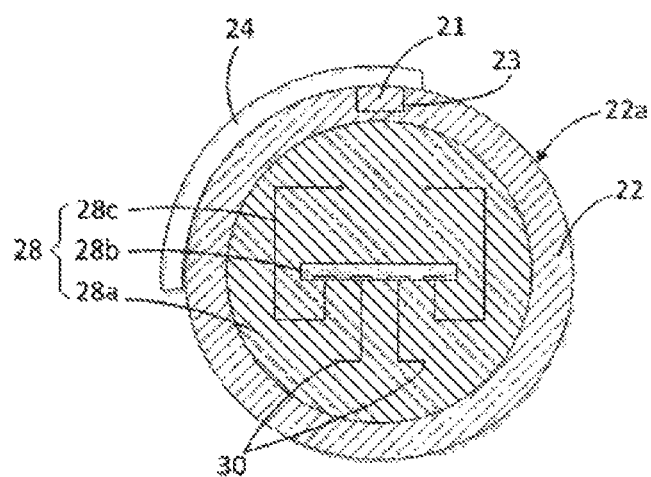
FIG. 2 is a partial cross-section schematic diagram of the flexible display module of the electronic device in FIG. 1.

Preferably, still in conjunction with FIG. 2, a controller 21 for driving the flexible screen 24 is provided at one end of the flexible screen 24 fixed to the rotating shaft 22 and facing towards the rotating shaft 22, one receiving hole 23 is provided on the rotating shaft 22, and the controller 21 is housed in the receiving hole 23 so that a surface of the flexible screen 24 opposite to the rotating shaft 22 will not become unsmooth due to the presence of the controller 21. In the figure, it is illustrated that the receiving hole 23 is provided on the outer wall 22a without penetrating through the external wall, however, it can be understood that in other embodiments, the receiving hole 23 also can penetrate through the outer wall 22a, and the controller 21 also can enter the passage.

A driving control signal driving the flexible screen 24 enters the flexible screen through the first connecting element 26. In the present embodiment, the first connecting element 26 is a flexible circuit board, substantially in a U shape, and has one end electrically connected to the flexible screen 24 and the other end extended to one axial end of the rotating shaft 22. In conjunction with FIG. 2, the first adapting part 28 is housed in the passage 22b of the rotating shaft, and it includes one insulating body 28a, one first interface 28b and a plurality of leads 28c provided on the body 28a. The body 28a is preferably tightly fitted in the passage 22b, and of course also can be loosely fitted. The first interface 28b is matched with one end of the first connecting element 26 close to the rotating shaft 22 so as to be connected therewith. The leads 28c are electrically connected to the first interface 28b and extend to the outside of the body 28a so that intervals between ends of respective leads 28c are large, and each end is electrically connected to one corresponding wire 30. Four wires are illustrated in the present embodiment, while it should be understood that the number of the wires 30 can be set as practically required.

A connecting manner of the wires 30 with the second adapting part 32, and structures and connecting manner of the second adapting part 32 and the second connecting element 34 are substantially the same as that described about the first connecting element 26 and the first adapting part 28 in the above, and the difference lies in that the second adapting part 32 is extended to the outside of the passage 22b and fixed to the outer ring of the bearing 23. The second connecting element 34 is further connected to the circuit board 14. The wires 30 are loosely housed in the passage 22b, i.e. the length of each wire 30 is larger than the distance between the first connecting part 28 and the second adapting part 32, and are separated from an internal wall of the rotating shaft 22 with a certain gap so as to allow the wires 30 to be enwound with each other inside the passage 22b. Thus, the driving control signal sent by the circuit board 14 for driving the flexible screen 24 is transferred to the flexible screen 24 through the second connecting element 34, the second adapting part 32, the wire 30, the first adapting part 28 and the first connecting element 26 in sequence.

Figure 3:
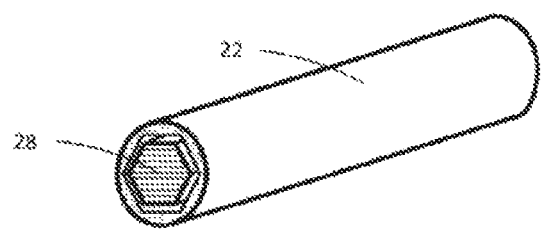
FIG. 3 is a schematic diagram of another embodiment of a rotating shaft and a first adapting part of the electronic device of the present disclosure.

During operation, when the flexible screen 24 is unfolded and extended to the outside of the casing 12, the respective wires 30 are not enwound with each other, as illustrated in FIG. 1. When the rotating shaft 22 rotates and the flexible screen 24 is wound around the rotating shaft 22, the first adapting part 28 rotates along with the rotating shaft 22, while the second adapting part 32 does not rotate along. Thus, as being driven by the first adapting part 28, respective wires 30 will be enwound with each other to be twisted together. If the length of the wires 30 twisted together is not less than the interval between the two adapting parts, the first adapting part 28 can be tightly fitted with the rotating shaft 22; otherwise, the first adapting part 28 should be allowed to be slidable in the axial direction relative to the rotating shaft 22, at this time, the first adapting part 28 preferably cannot rotate relative to the rotating shaft 22, for example, a polygonal anti-rotation structure as illustrated in FIG. 3 can be used. Of course, the anti-rotation structure also can be a concave-convex structure and so on provided in the axial direction between the first adapting part 28 and the rotating shaft 22.

When the flexible screen 24 needs to be unfolded to have a relatively large area, or when the rotating shaft 22 has a relatively small diameter, or in both cases, in order to reach the required unfolded area, the rotating shaft 22 needs to rotate more turns. At this time, for the structure described in BACKGROUND, the "electric brush" will be greatly worn so that its aging rate is accelerated, and further the usage life of the flexible screen module 20 is affected. In the present disclosure, the wires 30 are used to replace the "electric brush" structure which needs more turns of rotation, the wires 30, which are enwound with other wires during the rotation process of the rotating shaft 22, merely deform but are not worn, such that they are not easy to break, thus improving the usage lives of the flexible screen module 20 and the electronic device 10.

In other embodiments, the first adapting part 28 also can be extended to the outside of the passage 22b and fixed with the rotating shaft 22. At this time, the bearing 23 close to the first adapting part 28 also can be fixedly provided on the first adapting part 28 (not illustrated in the figures).

Figure 4:
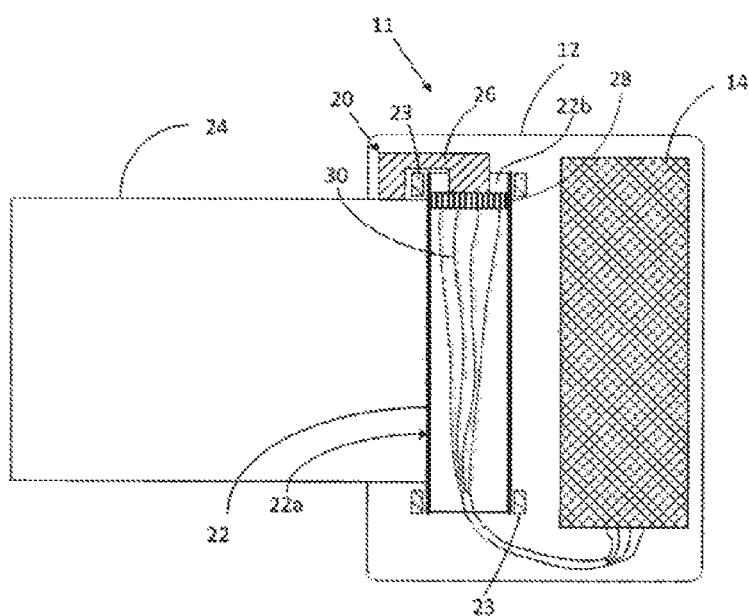
FIG. 4 is a schematic diagram of an electronic device having a flexible display module provided in a second embodiment of the present disclosure.

It can be understood that in other embodiments, one end of the wire 30 away from the first adapting part 28 can be directly connected to the circuit board 14, as illustrated in FIG. 4. At this time, the wire 30 is extended to the outside of the passage 22b, and the second adapting part 32 in the above embodiment may not need to be provided. In this situation, since interwinding of the wires with each other is still used, it also has the merit of improving the usage life of the flexible screen module 20 brought by the above embodiments.

Figure 5:
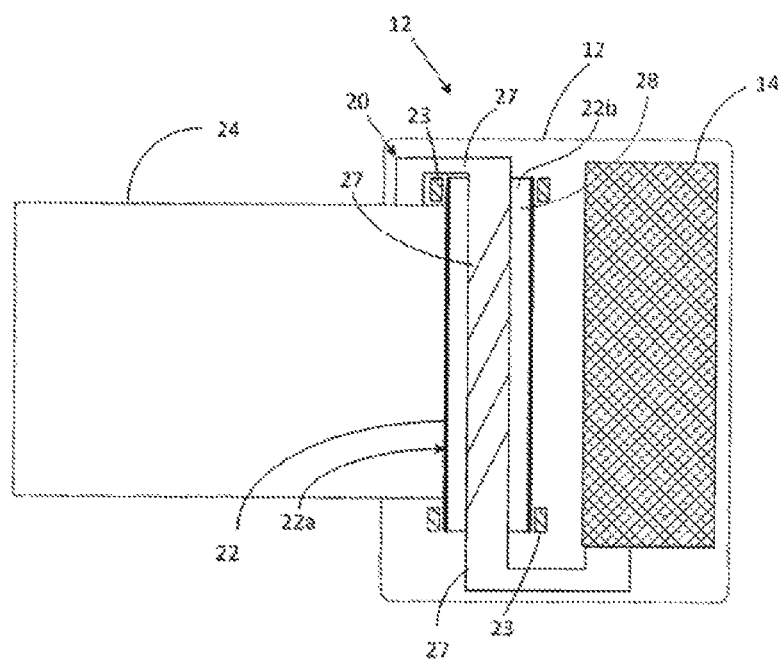
FIG. 5 is a schematic diagram of an electronic device having a flexible display module provided in a third embodiment of the present disclosure.

It can be understood that in other embodiments, the connector 27 acts as the flexible circuit board can be directly connected with the circuit board after directly passing through the passage 22b, at this time the length of the connector 27 in the passage 22b is larger than the length of the passage 22b so as to allow it to be also wound during the process of rotation of the rotating shaft 22, so that the first connecting element is not damaged by the winding. Preferably, the connector 27 is wound into a spiral shape in the passage 22b, as illustrated in FIG. 5. Thus, when the rotating shaft 22 starts to rotate and the connector 27 starts to be changed from a loose state to a relatively tensioned state, since it is already in the winding state, the connector 27 will be further wound, which can prevent occurrence of damage to the first connecting element 26 due to disordered deformation in the passage 22b.

It can be seen from the above various embodiments that the connector 27 in FIG. 5 actually also serves the functions of the first connecting element 26, the first adapting part 28, the wires 30, the second adapting part 32 and the second connecting element 34 in FIG. 1, and likewise also serves the functions of the first connecting element 26, the first adapting part 28 and the wires 30 in FIG. 4. Therefore, it can be seen that any technical solution providing the following flexible screen module should fall within the scope of protection of the present disclosure: a flexible screen module, comprising one rotating shaft, one flexible screen and one connector, wherein the rotating shaft has an external wall and a passage penetrating through the rotating shaft in an axial direction; one end of the flexible screen is fixed on the external wall and is able to be wound around the rotating shaft; the connector comprises a body, a first connecting part which is on one end of the body and electrically connected to the flexible screen and a second connecting part on the other end of the body, wherein the body at least partially passes through the passage and the first connecting part and the second connecting part are located outside two sides in the axial direction of the rotating shaft.

The above is merely for preferable embodiments of the present disclosure and not intended to limit the present disclosure. Any modifications, equivalent substitutions and improvements and so on made within the spirit and principle of the present disclosure should fall within the scope of protection of the present disclosure.

What is claimed is:

1. A flexible screen module, comprising:
    a rotating shaft, having an external wall and a passage extending through the rotating shaft in an axial direction thereof;
    a flexible screen, having one end fixed to the external wall and being rollable around the rotating shaft; and
    a connector, comprising a body, a first connecting part which is on one end of the body and electrically connected to the flexible screen, and a second connecting part on another end of the body, wherein the body at least partially passes through the passage, and the first connecting part and the second connecting part are located outside two sides in the axial direction of the rotating shaft, the first connecting part is configured to rotate along with the rotating shaft, and the second connecting part is fixed relative to the rotating shaft, the body comprises at least two wires at least partially loosely housed in the passage, when the flexible screen is wound around the rotating shaft, the at least two wires are enwound with each other inside the passage.

2. The flexible screen module according to claim 1, wherein the connector is a flexible circuit board.

3. The flexible screen module according to claim 2, wherein the body is at least partially wound and housed in the passage.

4. The flexible screen module according to claim 3, wherein a winding portion of the body is in a spiral shape.

5. The flexible screen module according to claim 1, wherein the connector comprises:
    a connecting element, having the first connecting part;
    the at least two wires, at least partially loosely housed in the passage; and
    a first adapting part, at least partially received in the passage and electrically connecting the connecting element to the at least two wires.

6. The flexible screen module according to claim 5, wherein the connecting element is a flexible circuit board, and the first adapting part comprises a first interface connected to the connecting element.

7. The flexible screen module according to claim 5, further comprises bearings fixed relative to the rotating shaft and located at both sides of the flexible screen.

8. The flexible screen module according to claim 5, wherein an anti-rotation structure is provided between the first adapting part and the rotating shaft, which prevents the first adapting part from rotating relative to the rotating shaft and is slidable in the passage in an axial direction thereof.

9. The flexible screen module according to claim 5, wherein the connector further comprises one second adapting part having a second interface, and the second adapting part electrically connects the at least two wires to the second interface.

10. The flexible screen module according to claim 9, further comprising bearings fixed to the rotating shaft and located at both sides of the flexible screen, and the second adapting part is fixed to the bearing close to the second adapting part and fixed relative to the rotating shaft.

11. The flexible screen module according to claim 10, wherein a length of each of the at least two wires is larger than a distance between the first adapting part and the second adapting part.

12. The flexible screen module according to claim 10, wherein the second adapting part is at least partially received in the passage.

13. The flexible screen module according to claim 1, wherein the flexible screen has a controller fitted to the external wall of the rotating shaft, and the external wall of the rotating shaft is provided with a receiving hole receiving the controller.

14. An electronic device, comprising a flexible screen module, wherein the flexible screen module comprises:
    a rotating shaft, having an external wall and a passage extending through the rotating shaft in an axial direction thereof;
    a flexible screen, having one end fixed to the external wall and being rollable around the rotating shaft; and
    a connector, comprising a body, a first connecting part which is on one end of the body and electrically connected to the flexible screen and a second connecting part on another end of the body, wherein the body at least partially passes through the passage, and the first connecting part and the second connecting part are located outside two sides in the axial direction of the rotating shaft, the first connecting part is configured to rotate along with the rotating shaft, and the second connecting part is fixed relative to the rotating shaft, the body comprises at least two wires at least partially loosely housed in the passage, when the flexible screen is wound around the rotating shaft, the at least two wires are enwound with each other inside the passage.

15. The electronic device of claim 14, wherein the connector is a flexible circuit board.

16. The electronic device of claim 15, wherein the body is at least partially wound and housed in the passage.

17. The electronic device of claim 16, wherein a winding portion of the body is in a spiral shape.

18. The electronic device of claim 14, wherein the connector comprises:
    a connecting element, having the first connecting part;
    the at least two wires, at least partially loosely housed in the passage; and
    a first adapting part, at least partially received in the passage and electrically connecting the connecting element to the at least two wires.

19. The electronic device of claim 18, wherein the connecting element is a flexible circuit board, and the first adapting part comprises a first interface connected to the connecting element.

20. The electronic device of claim 18, wherein the flexible screen module further comprises bearings fixed relative to the rotating shaft and located at both sides of the flexible screen.

* * * * *